(12) United States Patent
Aoki et al.

(10) Patent No.: US 10,318,036 B2
(45) Date of Patent: *Jun. 11, 2019

(54) DISPLAY DEVICE

(71) Applicant: JAPAN DISPLAY INC., Minato-ku (JP)

(72) Inventors: Yoshiro Aoki, Tokyo (JP); Takashi Nakamura, Tokyo (JP); Masahiro Tada, Tokyo (JP); Hirotaka Hayashi, Tokyo (JP); Makoto Shibusawa, Tokyo (JP); Yutaka Umeda, Tokyo (JP); Miyuki Ishikawa, Tokyo (JP)

(73) Assignee: JAPAN DISPLAY INC., Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/128,018

(22) Filed: Sep. 11, 2018

(65) Prior Publication Data

US 2019/0004658 A1  Jan. 3, 2019

Related U.S. Application Data

(63) Continuation of application No. 15/889,915, filed on Feb. 6, 2018, now Pat. No. 10,101,839, which is a
(Continued)

(30) Foreign Application Priority Data

Oct. 4, 2013 (JP) .................................. 2013-209238

(51) Int. Cl.
*G09G 1/00* (2006.01)
*G06F 3/041* (2006.01)
(Continued)

(52) U.S. Cl.
CPC ........ *G06F 3/0412* (2013.01); *G02F 1/13338* (2013.01); *G06F 3/044* (2013.01);
(Continued)

(58) Field of Classification Search
CPC ................. G09G 1/00; G09G 2230/00; G09G 2300/023; G06F 3/0412
See application file for complete search history.

(56) References Cited

U.S. PATENT DOCUMENTS

2010/0052521 A1* 3/2010 Kim ...................... G06F 3/0412
313/504

FOREIGN PATENT DOCUMENTS

JP   2011-023558   2/2011
JP   5161165      12/2012

* cited by examiner

*Primary Examiner* — Michael A Faragalla
(74) *Attorney, Agent, or Firm* — Oblon, McClelland, Maier & Neustadt, L.L.P.

(57) ABSTRACT

According to one embodiment, a lateral-electric-field liquid crystal display device includes a light-emitting display layer including OLEDs and a driving circuit controlling light emission of the OLEDs, a moisture impermeable film provided to be laminated on the light-emitting display layer to prevent infiltration of moisture into the light-emitting display layer, an optical substrate provided separately from the moisture impermeable film and subjecting light from the light-emitting display region to optical processing, a first touch electrode group serving as one electrode group of touch electrodes and provided on a back surface of the optical substrate, and an extraction electrode group formed to be laminated on the moisture impermeable film, the extraction electrode group and the optical substrate have an overlapping part in plan view, and electrodes of the first touch electrode group being electrically connected to elec-
(Continued)

trodes of the extraction electrode group in the overlapping part.

10 Claims, 12 Drawing Sheets

Related U.S. Application Data continuation of application No. 15/379,309, filed on Dec. 14, 2016, now Pat. No. 9,921,676, which is a continuation of application No. 15/180,704, filed on Jun. 13, 2016, now Pat. No. 9,547,403, which is a continuation of application No. 14/995,972, filed on Jan. 14, 2016, now Pat. No. 9,383,880, which is a continuation of application No. 14/505,880, filed on Oct. 3, 2014, now Pat. No. 9,262,030.

(51) Int. Cl.
*G06F 3/044* (2006.01)
*G02F 1/1333* (2006.01)
*G06F 3/047* (2006.01)
*H01L 27/32* (2006.01)
*H01L 51/52* (2006.01)

(52) U.S. Cl.
CPC ............ *G06F 3/047* (2013.01); *G06F 3/0416* (2013.01); *H01L 27/323* (2013.01); *H01L 51/524* (2013.01); *H01L 51/5237* (2013.01); *H01L 51/5253* (2013.01); *G06F 2203/04103* (2013.01); *G06F 2203/04107* (2013.01); *G06F 2203/04111* (2013.01); *G06F 2203/04112* (2013.01)

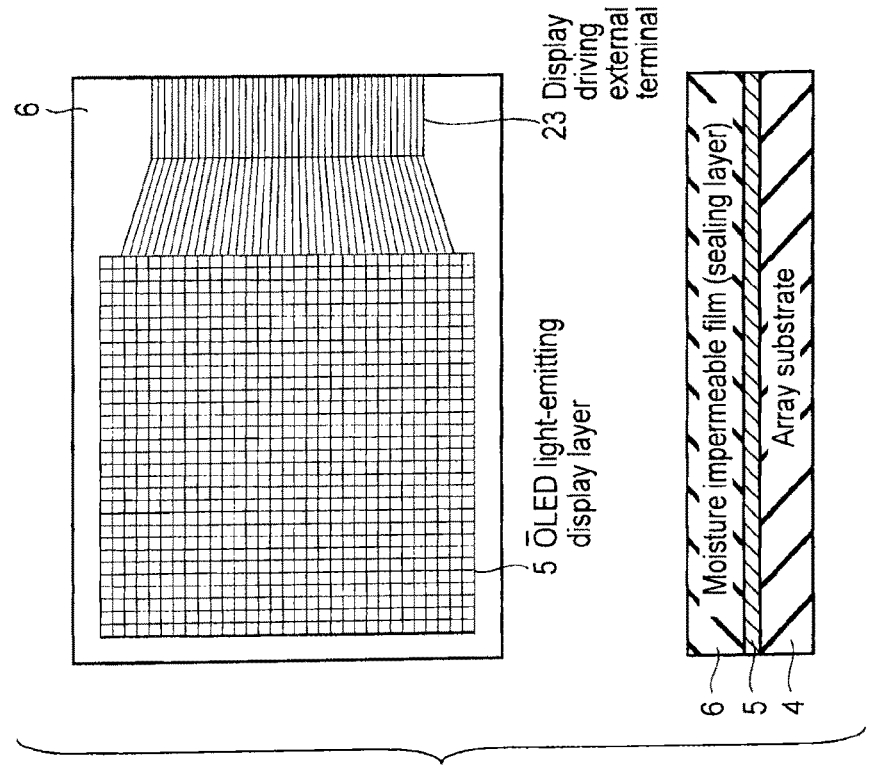
F I G. 4B
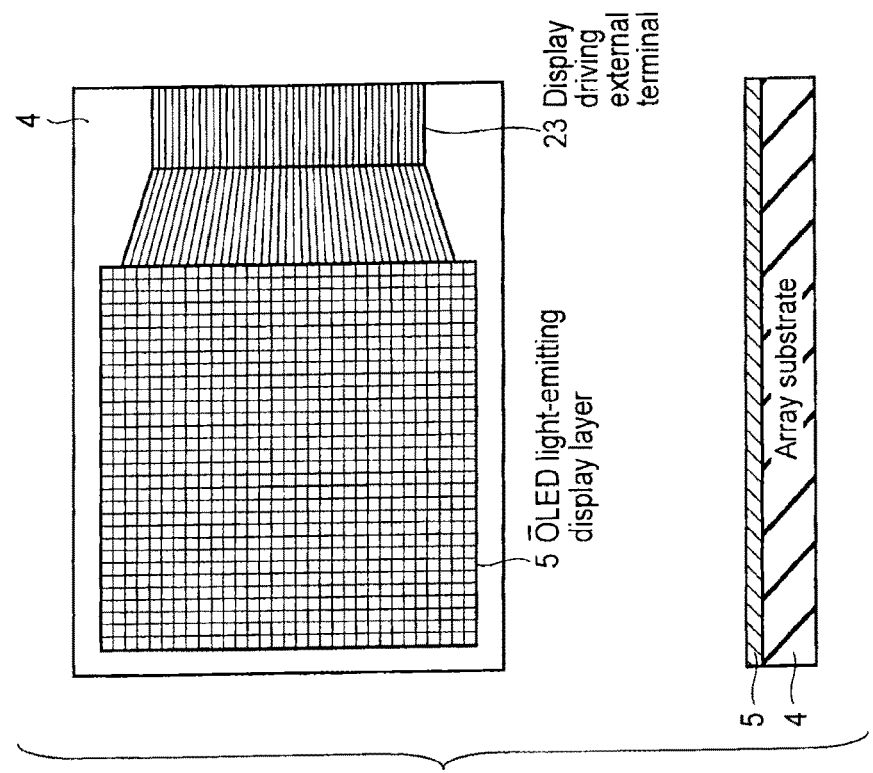
F I G. 4A

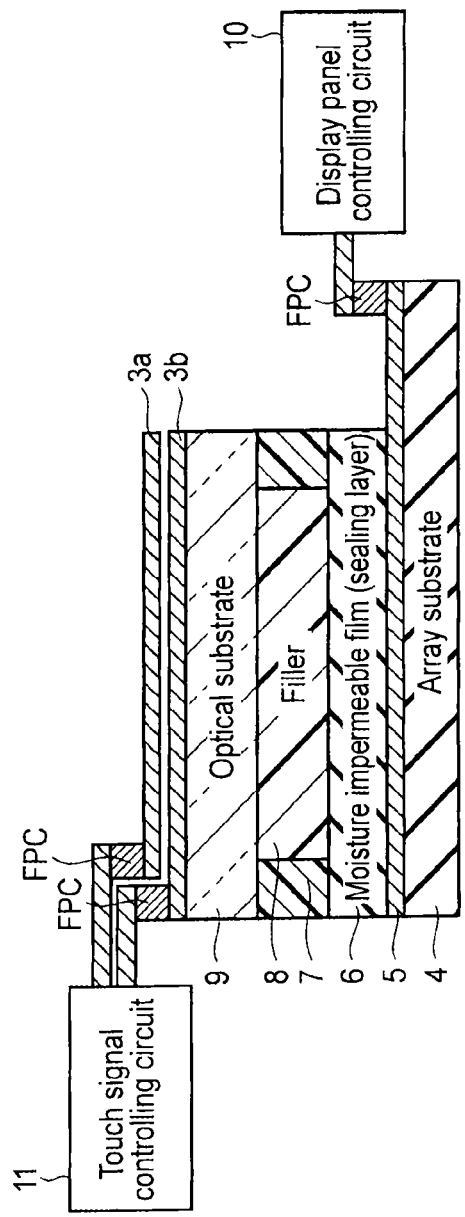
F I G. 11

DISPLAY DEVICE

CROSS-REFERENCE TO RELATED APPLICATIONS

This application is a continuation of U.S. application Ser. No. 15/889,915, filed Feb. 6, 2018, which is a continuation of U.S. application Ser. No. 15/379,309, filed Dec. 14, 2016, which is a continuation of U.S. application Ser. No. 15/180,704, filed Jun. 13, 2016, which is a continuation of U.S. application Ser. No. 14/995,972, filed on Jan. 14, 2016, which is a continuation of U.S. application Ser. No. 14/505,880 filed Oct. 3, 2014, now U.S. Pat. No. 9,262,030 and is based upon and claims the benefit of priority from Japanese Patent Application No. 2013-209238, filed Oct. 4, 2013, the entire contents of all of which are incorporated herein by reference.

FIELD

Embodiments described herein relate generally to a display device.

BACKGROUND

Electronic apparatuses such as mobile phones, personal digital assistants, and personal computers have been developed. Such electronic apparatuses are equipped with a display device including a touch panel function as a form of user interface. These electronic apparatuses usually include a capacitive touch panel function. In a capacitive touch panel, conductive electrodes are disposed on the panel, and a contact position of a finger or a pen on the surface of the panel is sensed based on change in capacity between the electrode and the finger or the like.

An electronic apparatus having the above touch panel function is known as having a structure in which a touch panel board is separately bonded to a display device such as a liquid crystal display device and an organic EL display device, to add a touch panel function.

In the meantime, in electronic apparatuses using a liquid crystal device (LCD), an in-cell structure is being generalized. In the in-cell structure, a touch panel function is formed inside the LCD device. Adopting the in-cell structure produces the merit that the thickness and the weight of the devices are reduced, because it becomes unnecessary to use a dedicated touch panel.

On the other hand, in OLED display devices using organic light emitting diodes (OLED), it is difficult to provide a touch panel function inside in the same form as LCD devices, because a cathode provided on the whole light-emitting display surface thereof serves as an electromagnetic shield.

BRIEF DESCRIPTION OF THE DRAWING

A general architecture that implements the various features of the embodiments will now be described with reference to the drawings. The drawings and the associated descriptions are provided to illustrate the embodiments and not to limit the scope of the invention.

FIG. 4A is a diagram for explaining a method for forming a moisture impermeable film in the display device according to the first embodiment.

FIG. 4B is a diagram for explaining a method for forming a moisture impermeable film in the display device according to the first embodiment.

FIG. 11 is a cross-sectional view illustrating a structure of a display device discussed to be compared with the display device of the present embodiment.

DETAILED DESCRIPTION

Various embodiments will be described hereinafter with reference to the accompanying drawings.

In general, according to one embodiment, a display device includes a light-emitting display layer including a light-emitting display region formed of OLEDs and a driving circuit controlling light emission of the OLEDs, a moisture impermeable film provided to be laminated on the light-emitting display layer to prevent infiltration of moisture into the light-emitting display layer, an optical substrate provided separately from the moisture impermeable film and subjecting light from the light-emitting display region to optical processing, a first touch electrode group serving as one electrode group of touch electrodes and provided on a back surface of the optical substrate, and an extraction electrode group formed to be laminated on the moisture impermeable film, the extraction electrode group and the optical substrate have an overlapping part in plan view, and electrodes of the first touch electrode group being electrically connected to electrodes of the extraction electrode group in the overlapping part.

First Embodiment

Figure 1:
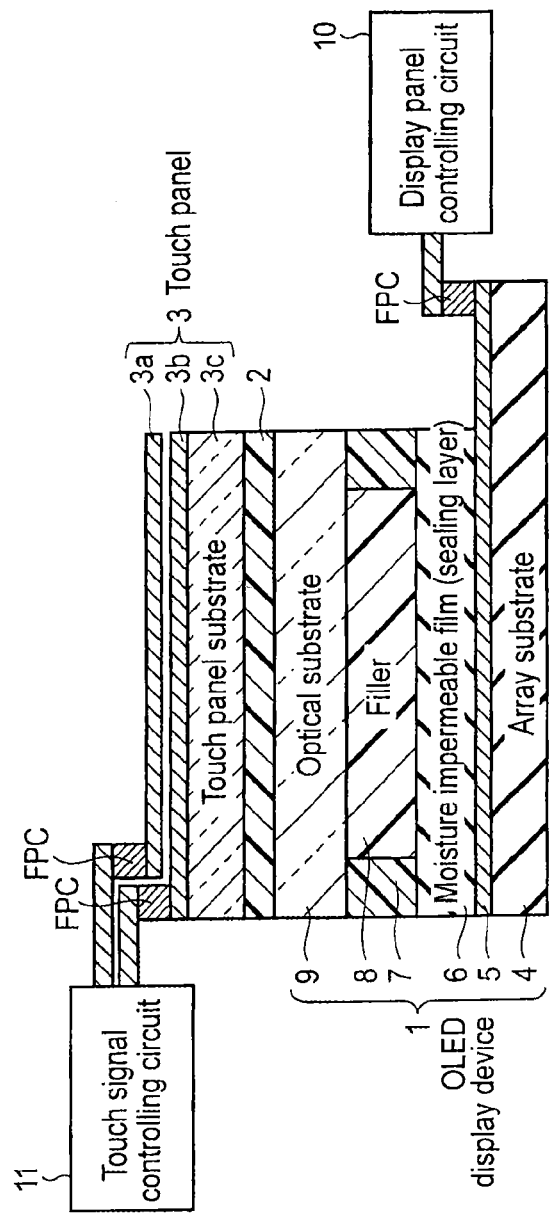
FIG. 1 is a cross-sectional view illustrating a structure of a display device discussed prior to the invention.

FIG. 1 is a cross-sectional view illustrating a structure of a display device discussed prior to the present invention.

The display device illustrated in FIG. 1 comprises an OLED display device 1, an adhesive layer 2, and a touch panel 3. Specifically, the touch panel 3 is bonded onto the OLED display device 1 via the adhesive layer 2.

The touch panel 3 includes first touch electrodes 3a and second touch electrodes 3b that are placed on a touch panel substrate 3c. The touch panel substrate 3c is formed of transparent glass or plastic. The first touch electrodes 3a and the second touch electrodes 3b are transparent electrodes using a material such as ITO (Indium Tin Oxide) and a silver nanowire, and are arranged on the touch panel substrate 3c as, for example, a number of mosaic electrode patterns formed of columns and rows. Each of the first touch electrodes 3a and the second touch electrodes 3b is electrically connected to a touch signal controlling circuit 11 via an FPC (Flexible Print Circuit) serving as a touch connection component. The touch panel 3 senses an approaching (contact) position of a dielectric such as a finger by change in capacitance of the touch electrodes 3a and 3b.

The OLED display device 1 includes an array substrate 4, an OLED light-emitting display layer 5, a moisture impermeable film (sealing layer) 6, a seal material 7, a filler 8, and an optical substrate 9 that are provided on the array substrate 4.

The array substrate 4 is an insulating substrate formed of glass, quartz, ceramics, or plastic. The OLED light-emitting display layer 5 is provided with a light-emitting layer including organic light-emitting diodes (OLED), and a driving circuit to control light-emitting operations of the OLEDs. The light-emitting layer is a thin film including luminescent organic compound that emits light of red, green, blue, or an achromatic color. A TFT (thin-film transistor) that forms the driving circuit is formed of low-temperature polysilicon. The driving circuit is supplied with a driving signal from a display panel controlling circuit 10 that is electrically connected via an FPC.

The colors of light emitted from the OLEDs are not necessarily divided into red, green, blue, and an achromatic color, but may be only an achromatic color. In such a case, the OLEDs may be used in combination with red, green, and blue color filters to emit light of red, green, blue, or an achromatic color.

The moisture impermeable film 6 seals the OLEDs and the thin-film transistor to prevent moisture from infiltrating from the outside. The seal material 7 serving as a holding member is provided between the moisture impermeable film 6 and the optical substrate 9. The seal material 7 is provided in a frame shape in peripheral regions of the moisture impermeable film 6 and the optical substrate 9, and a space surrounded by the moisture impermeable film 6, the optical substrate 9, and the seal material 7 is filled with the filler 8. The filler 8 is, for example, a thermosetting resin that prevents moisture from infiltrating from the outside and enhances impact resistance.

The optical substrate 9 is properly provided with a member that subjects light from the OLEDs to optical processing, such as an optical element such as a color filter and a polarizer, and a black matrix. Although a color filter is required in the case where the OLEDs emit light of an achromatic color as described above, a color filter is not always required in the case where the OLEDs emit light of red, green, or blue color. A polarizer is provided in the case of reducing reflected light.

Figure 2:
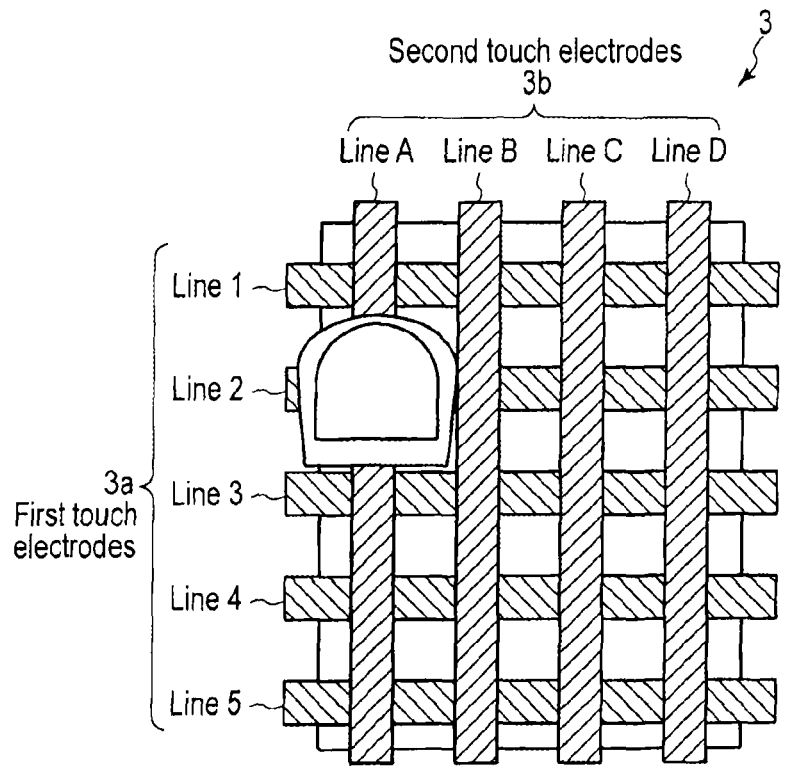
FIG. 2 is a schematic diagram illustrating a structure of a touch panel.

FIG. 2 is a schematic diagram illustrating a structure of the touch panel 3.

The touch panel 3 is provided with a plurality of transparent first touch electrodes 3a (line 1, line 2, . . . ) extending in the horizontal direction and a plurality of transparent second touch electrodes 3b (line A, line B, . . . ) extending in the vertical direction in a lattice shape. The first touch electrodes 3a and the second touch electrodes 3b are arranged in different layers via a transparent insulating film (not illustrated).

FIG. 2 illustrates the state where the finger touches a point close to an intersection point between the first touch electrode 3a in line 2 and the second touch electrode 3b in line A. In this state, the finger serving as a dielectric changes the mutual capacitance between the first touch electrode 3a in line 2 and the second touch electrode 3b in line A. Thus, the position where the finger is located can be sensed by measuring the mutual capacitance between the first touch electrode 3a and the second touch electrode 3b.

The finger serving as a dielectric changes the self capacitance of the first touch electrode 3a of line 2 or the self capacitance of the second touch electrode 3b of line A. The term "self capacitance" indicates capacitance that exists between each first touch electrode 3a or second touch electrode 3b and the ambient conductor. Thus, it is possible to sense the position where the finger is located, by measuring change in self capacitance with the first touch electrode 3a or the second touch electrode 3b caused by touch of the finger.

For example, the sensing operation is executed as follows.

The touch signal controlling circuit 11 supplies a signal to the first touch electrode 3a of line 1 and reads signals of the respective second touch electrodes 3b (line A, line B, . . . ). Each of the read signals includes information relating to the mutual capacitance between the first touch electrode 3a and the second touch electrode 3b. Next, the touch signal controlling circuit 11 supplies a signal to the first touch electrode 3a of line 2 and reads signals of the respective second touch electrodes 3b (line A, line B, . . . ). This operation is performed with the first touch electrode 3a successively switched, and thereby the position where the finger is present (the position of the first touch electrode 3a and the position of the second touch electrode 3b) can be sensed. The operation can be achieved by outputting, by the touch signal controlling circuit 11, an alternative-current waveform signal (such as a square wave signal), switching the first touch electrode 3a to be supplied with a signal in synchronization with the alternative-current waveform signal, and reading signals of the respective second touch electrodes 3b (line A, line B, . . . ).

In the process of manufacturing the display device illustrated in FIG. 1, first, the moisture impermeable film 6, the filler 8, and the optical substrate 9 are laminated on the array substrate 4 provided with the OLED light-emitting display layer 5, to form the OLED display device 1. In addition, the touch panel 3 in which the touch electrodes 3a and 3b are provided on the touch panel substrate 3c is formed separately. Then, at the final step of the display device, the touch panel 3 is bonded via the adhesive layer 2.

As described above, the display device having the structure illustrated in FIG. 1 requires a step of adding the touch panel 3 separately from the process of manufacturing the OLED display device 1. This structure complicates the process, and increases the cost. In addition, this structure has demerits such as increase in size in the thickness direction of the display device.

Figure 3:
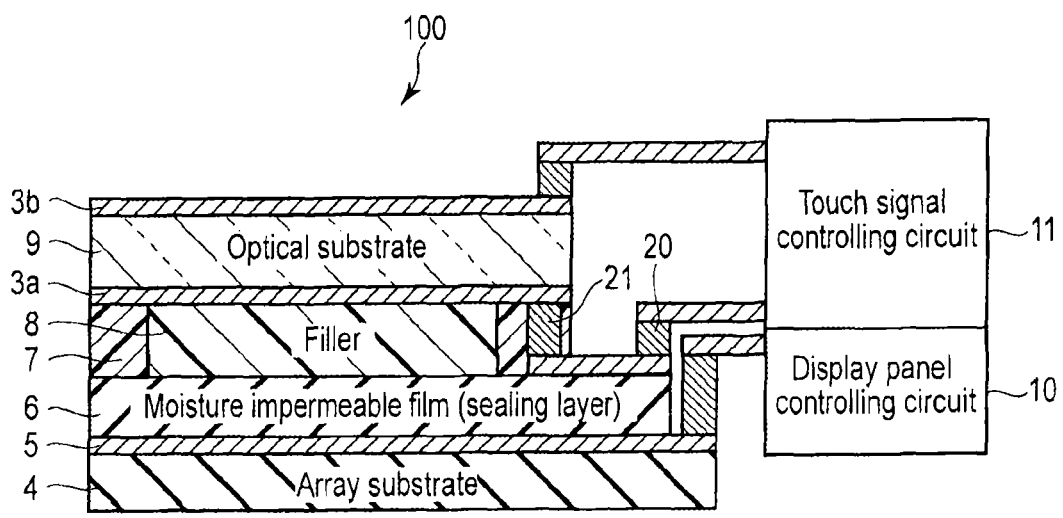
FIG. 3 is a cross-sectional view illustrating a structure of a display device according to a first embodiment.

FIG. 3 is a cross-sectional view illustrating a structure of a display device 100 according to the first embodiment. Constituent elements having the same functions as those of the display device of FIG. 1 are denoted by same reference numerals, and detailed explanation thereof are omitted.

The display device 100 illustrated in FIG. 3 has a structure in which a moisture impermeable film 6, a seal material 7, a filler 8, and an optical substrate 9 are laminated on an array substrate 4 provided with an OLED light-emitting display layer 5. In addition, a back surface (a surface opposed to the array substrate) of the optical substrate 9 is provided with first touch electrodes 3a, and a front surface of the optical substrate 9 is provided with second touch electrodes 3b.

The second touch electrodes 3b are electrically connected to a touch signal controlling circuit 11 via an FPC at an end part of the optical substrate 9. On the other hand, an end part of the first touch electrodes 3a is not provided with an FPC to electrically connect to the touch signal controlling circuit 11.

In the first embodiment, part of the region of the moisture impermeable film 6 is extended toward the side on which a signal line is drawn out, in comparison with the structure illustrated in FIG. 1. Then, an external extraction electrode 20 is formed on an upper layer of the extended region, and an end of the external extraction electrode 20 is electrically connected to the touch signal controlling circuit 11 via an FPC. The other end of the external extraction electrode 20 is held between the seal material 7 and the moisture impermeable film 6.

The seal material 7 includes conductive particulates such as Au-plated pearl material. Thus, by pressing the optical substrate 9 and the moisture impermeable film 6, electrodes at an end part of the first touch electrodes 3a are electrically connected with electrodes at an end part of the external extraction electrode 20 via the conductive particulates. A connecting part 21 illustrated in FIG. 3 indicates the electrically connected region. The connecting part 21 is an electric circuit that is formed by pressing the optical substrate 9 and the moisture impermeable film 6.

Next, the process of manufacturing the display device 100 according to the first embodiment will be explained hereinafter.

Formation of Moisture Impermeable Film

FIG. 4A and FIG. 4B are diagrams for explaining a method for forming the moisture impermeable film in the display device according to the first embodiment.

As illustrated in FIG. 4A, the OLED light-emitting display layer 5 including OLED light-emitting devices, a driving circuit, and a display driving external terminal 23 is formed on the array substrate 4. The formation is performed with a step similar to that of a conventional method. Then, as illustrated in FIG. 4B, the moisture impermeable film 6 that covers the OLED light-emitting display layer 5 is formed on the whole surface of the array substrate 4.

Formation of Extraction Terminal

Figure 5B:
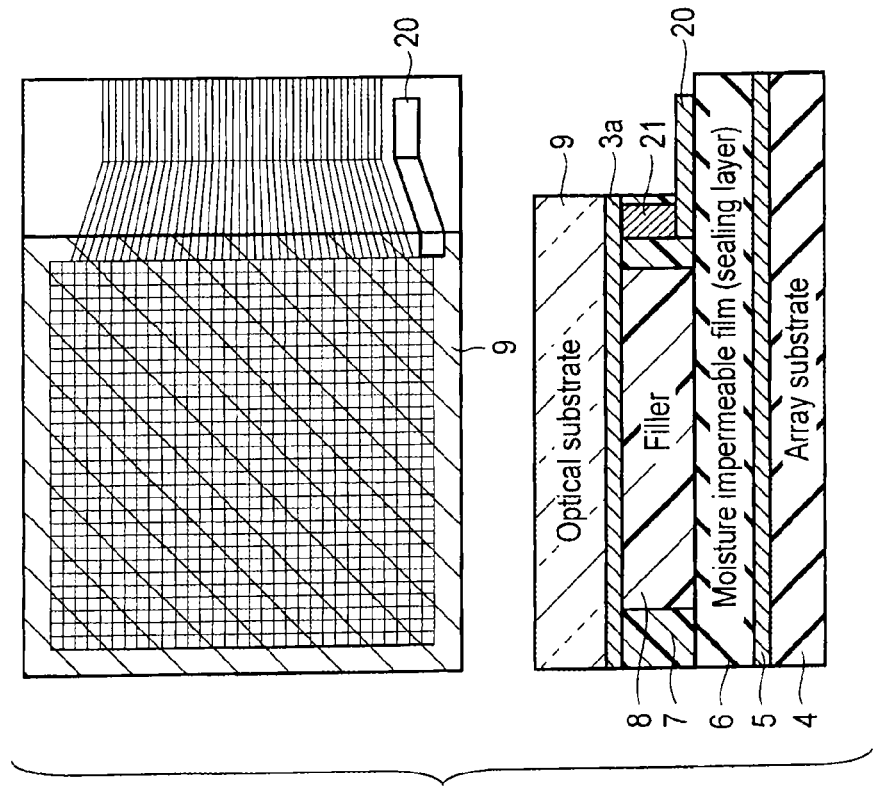
FIG. 5B is a diagram for explaining a method for forming an extraction terminal in the display device according to the first embodiment.
Figure 5A:
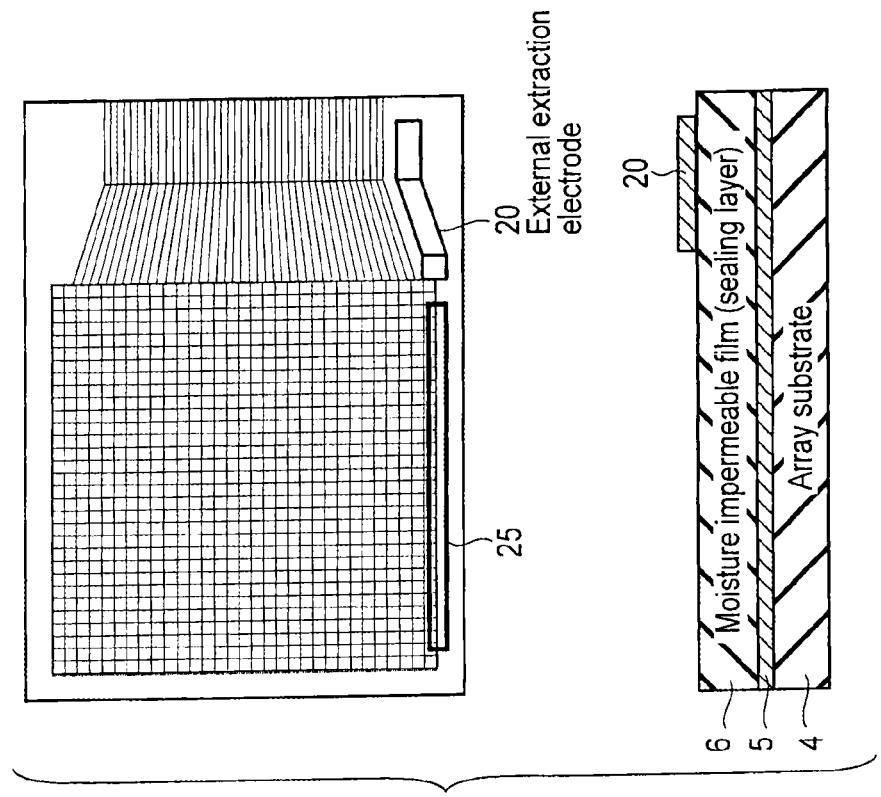
FIG. 5A is a diagram for explaining a method for forming an extraction terminal in the display device according to the first embodiment.

FIG. 5A and FIG. 5B are diagrams for explaining a method for forming an extraction terminal in the display device according to the first embodiment.

Figure 6:
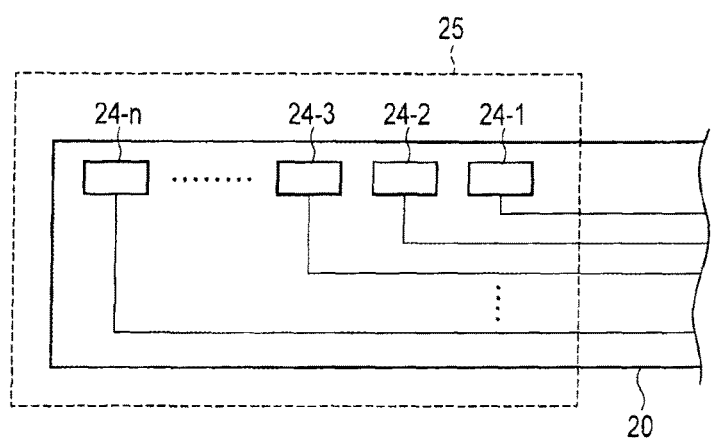
FIG. 6 is a diagram illustrating arrangement of connection pads in the display device according to the first embodiment.

As illustrated in FIG. 5A, a pattern of the external extraction terminal 20 is formed using a dry process such as mask deposition. A dry process is used to prevent deterioration of the OLED light-emitting devices due to moisture. As illustrated in FIG. 6, a plurality of connection pads 24 are arranged on the external extraction electrode 20. In FIG. 5A, for example, a plurality of connection pads 24 are provided in a range indicated by a region 25.

FIG. 6 is a diagram illustrating arrangement of connection pads in the display device according to the first embodiment.

As illustrated in FIG. 6, n extraction lines included in the external extraction electrode 20 are extended into the region 25, and connected with n connection pads (24-1, 24-2, ..., 24-n) provided at positions corresponding to end parts of the n first touch electrodes 3a. The connection pads 24 are electrically connected with the first touch electrodes 3a via the connecting part 21. FIG. 6 only illustrates an example, and arrangement positions of the connection pads 24 in the seal material can be properly determined in consideration of the structure of the first touch electrodes 3a and the size of the frame region.

Then, in FIG. 5B, resin serving as a material of the seal material 7 is disposed in a frame shape. As described above, the seal material 7 includes conductive particulates such as Au-plated pearl material. Next, the filler 8 is filled into a space enclosed by the seal material 7. Thereafter, the optical substrate 9 on which the first touch electrodes 3a are formed is positioned such that the first touch electrodes 3a are opposed to the array substrate 4, and the optical substrate 9 is bonded to the array substrate 4. In the bonding, the optical substrate 9 and the array substrate 4 are pressed to hold the seal material and the filler 8 therebetween, to form the connecting part 21.

Peeling the Moisture Impermeable Film and Exposing Driving Terminal

Figure 7B:
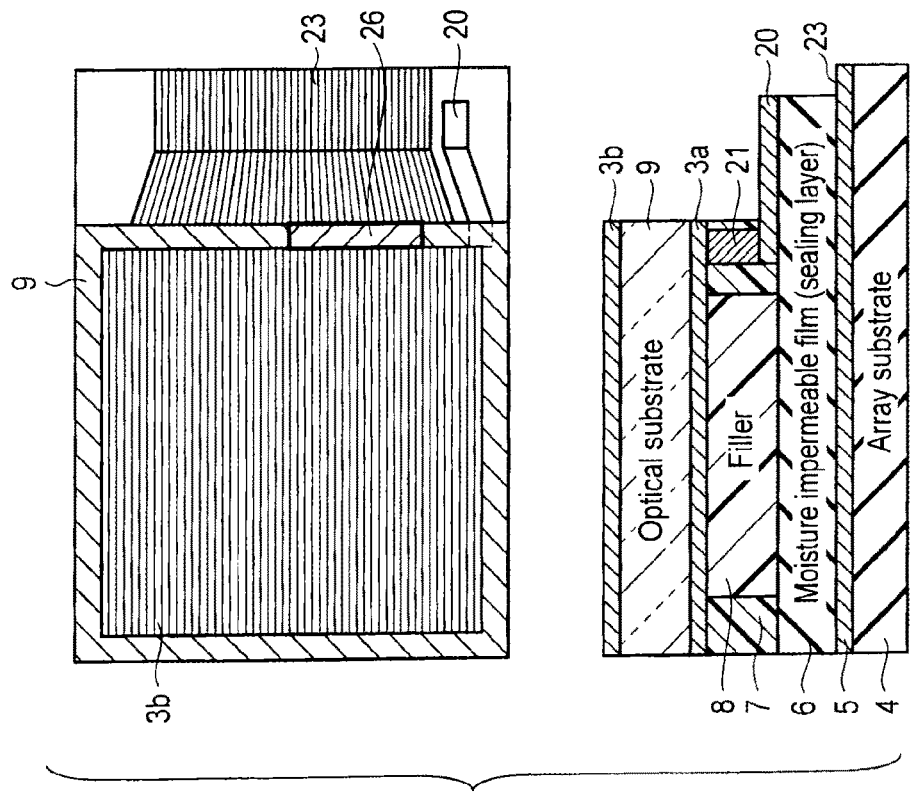
FIG. 7B is a diagram illustrating a method for peeling the moisture impermeable film and a method for exposing and extracting a driving terminal in the display device according to the first embodiment.
Figure 7A:
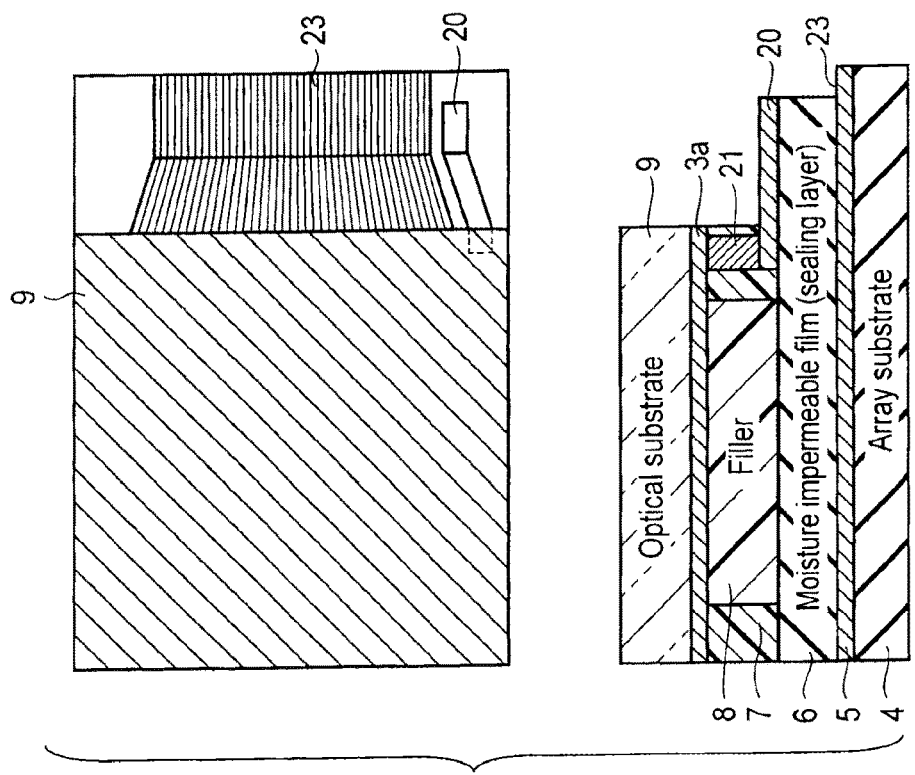
FIG. 7A is a diagram illustrating a method for peeling the moisture impermeable film and a method for exposing and extracting a driving terminal in the display device according to the first embodiment.

FIG. 7A and FIG. 7B are diagrams for explaining a method for peeling the moisture impermeable film and a method for exposing and extracting a driving terminal in the display device according to the first embodiment.

First, as illustrated in FIG. 7A, the whole panel manufactured is put into a sealing-layer-peeling gas to peel the moisture impermeable film 6. This treatment removes the moisture impermeable film 6 in a region other than the region covered with the optical substrate 9 and the external extraction electrode 20 in the plan view. As a result, the external extraction electrode 20 is formed at a position that is higher than the array substrate 4 by the thickness of the moisture impermeable film 6. However, the difference in height between the moisture impermeable film 6 and the array substrate 4 is minute.

Then, as illustrated in FIG. 7B, patterns of the second touch electrodes 3b and the external extraction electrode 26 are formed on the front surface of the optical substrate 9 by a dry process such as mask deposition.

Connection to External Driving Circuit

Figure 8:
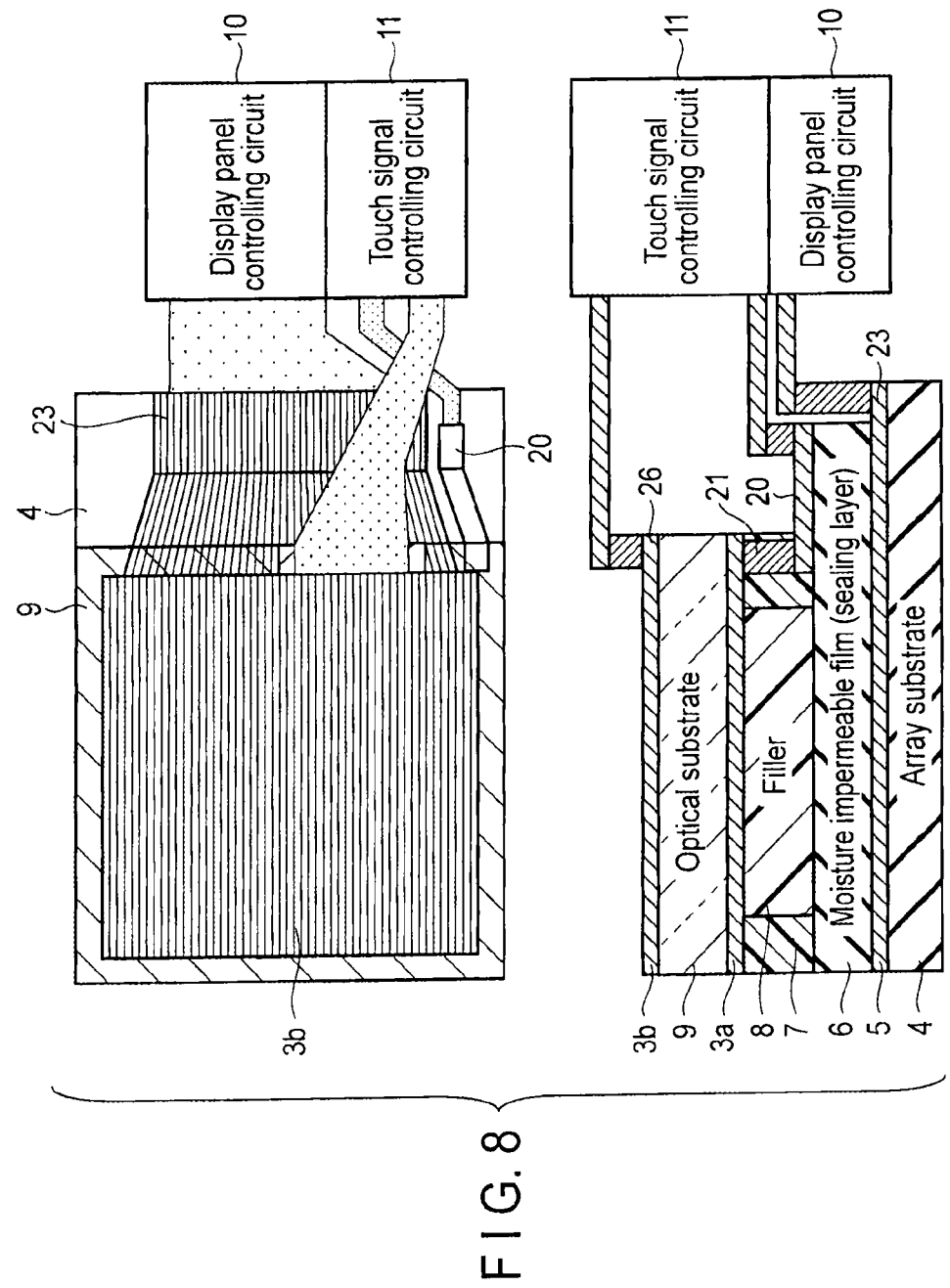
FIG. 8 is a diagram for explaining a method for connecting the display device according to the first embodiment to an external driving circuit.

FIG. 8 is a diagram for explaining a method for connection to the external driving circuit in the display device according to the first embodiment. The upper part of FIG. 8 is a plan view of the display device, and the lower part of FIG. 8 is a cross-sectional view of the display device.

An FPC to connect to the display panel controlling circuit 10 is attached to the display driving external circuit 23 connected to the OLED light-emitting display layer 5. In addition, an FPC connected to the touch signal controlling circuit 11 is attached to the external extraction electrode 20 that is electrically connected to the first touch electrode 3a, and another FPC connected to the touch signal controlling circuit 11 is attached to the external extraction electrode 26 connected to the second touch electrode 3b.

Both the two FPCs connected to the touch signal controlling circuit 11 are attached in the same direction from the front surface of the display device 100 toward the back surface of the display device 100. In addition, the FPC connected to the display panel controlling circuit 10 is also attached in the same direction. Thus, the display device 100 according to the present embodiment has an advantage of easier attachment of FPCs. Besides, because the difference in height between the surface of the moisture impermeable film 6 and the surface of the array substrate 4 is minute as described above, FPCs can be attached to the display panel controlling circuit 10 and the touch signal controlling circuit 11 simultaneously.

In the first embodiment, a signal is supplied to the first touch electrode 3a provided on the back surface of the optical substrate 9 to read signals of the respective second touch electrodes 3b. In consideration of attenuation of the signal in the connecting part 21, a sense signal with a good S/N ratio is obtained by the above structure. However, the display device may have a structure in which a signal is supplied to the second touch electrode 3b provided on the front surface of the optical substrate 9 to read signals of the respective first touch electrodes 3a.

With the display device according to the first embodiment explained above, it is possible to reduce the thickness and the weight of the display device.

Second Embodiment

The second embodiment is different from the first embodiment in that a black matrix BM of an optical substrate 9 also serves as first touch electrodes 3a. Constituent elements having functions that are the same as or similar to those of the first embodiment are denoted by same reference numerals, and detailed explanation thereof are omitted.

Figure 9:
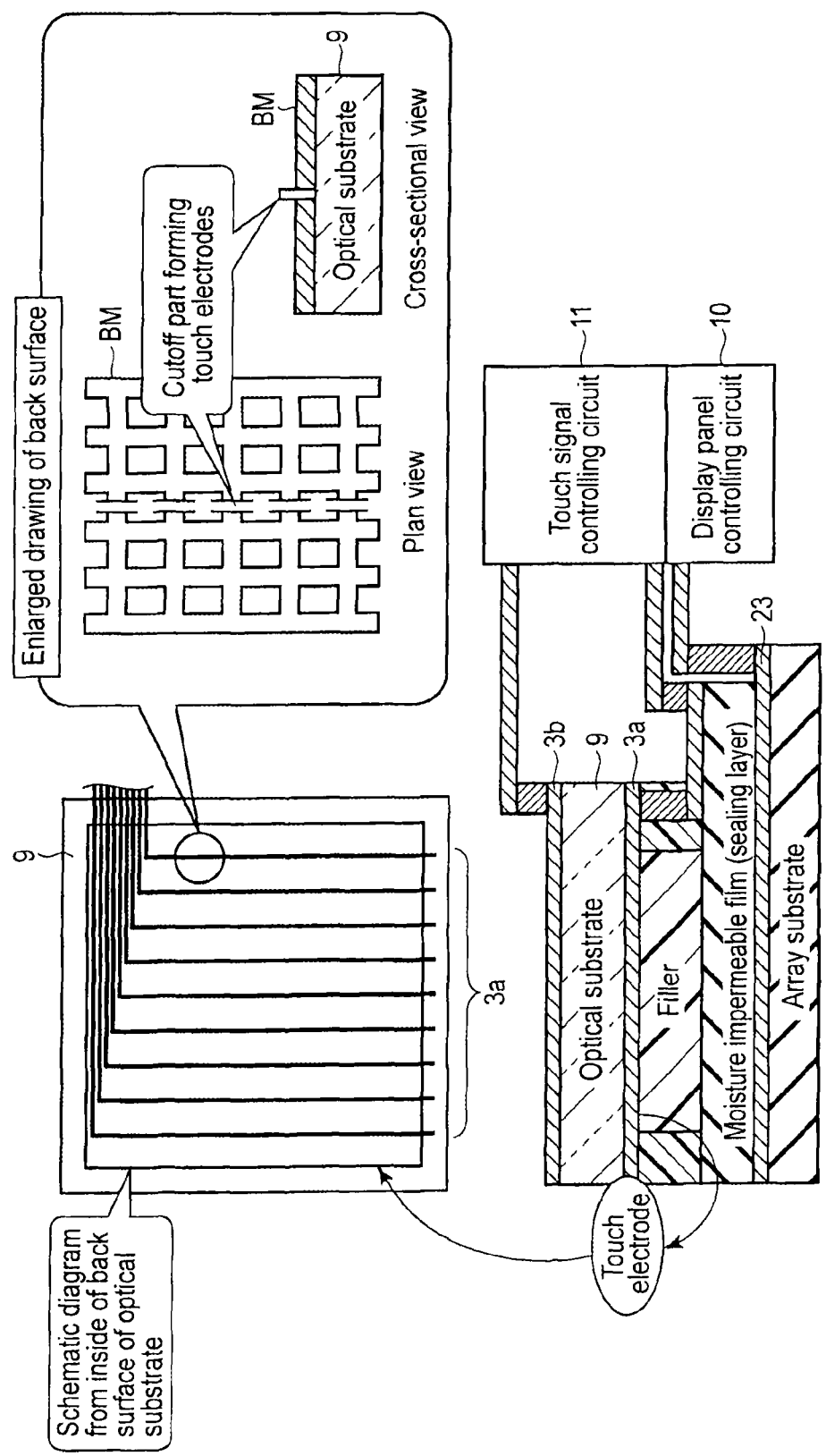
FIG. 9 is a diagram illustrating a structure of touch electrodes in a display device according to a second embodiment.

FIG. 9 is a diagram illustrating a structure of touch electrodes in a display device according to the second embodiment. The lower part of FIG. 9 shows a cross-sectional view of the display device according to the second embodiment. Because the cross-sectional view is the same as the cross-sectional view of the display device shown in the lower part of FIG. 8, detailed explanation thereof is omitted. The upper left part of FIG. 9 shows a plan view of the back surface of the optical substrate 9 as viewed from inside. The upper right part of FIG. 9 shows an enlarged view of the back surface.

In the second embodiment, the black matrix BM is formed of low-resistance conductors that are arranged to extend in parallel at predetermined pitches, and low-resistance conductors that are electrically connected to and cross the conductors and extend in parallel at other predetermined pitches. The black matrix BM is provided with cutoff parts to form a plurality of electrodes that extend in a predetermined direction (the vertical direction in FIG. 9). The width of each cutoff part is shorter than an interval (a pitch) between the adjacent low-resistance conductors extending in the predetermined direction. The cutoff parts are provided at intervals of a plurality of pitches in the horizontal direction. Thus, the influence of light leakage from the cutoff parts on the display image is small enough not to cause any problem.

The first touch electrodes 3a can be formed by drawing a plurality of electrodes formed by processing the black matrix BM as described above to be brought into contact with the connecting part 21. Although each cutoff part is provided on a vertical straight line in the upper right part of FIG. 9, the cutoff part is not limited to this form, but may be provided to form a plurality of electrodes that extend in a desired direction.

The second touch electrodes 3b may be formed in the same form as that of the first embodiment, or may be formed of low-resistance conductors in the same manner as the first touch electrodes 3a of the second embodiment. Forming both the touch electrodes 3a and 3b of low-resistance conductors suppresses attenuation of the touch signal.

According to the second embodiment, it is possible to further reduce the thickness and the weight of the display device.

Variation of the Second Embodiment

In a variation of the second embodiment, first touch electrodes 3a are laminated on a black matrix BM of an optical substrate 9.

Figure 10:
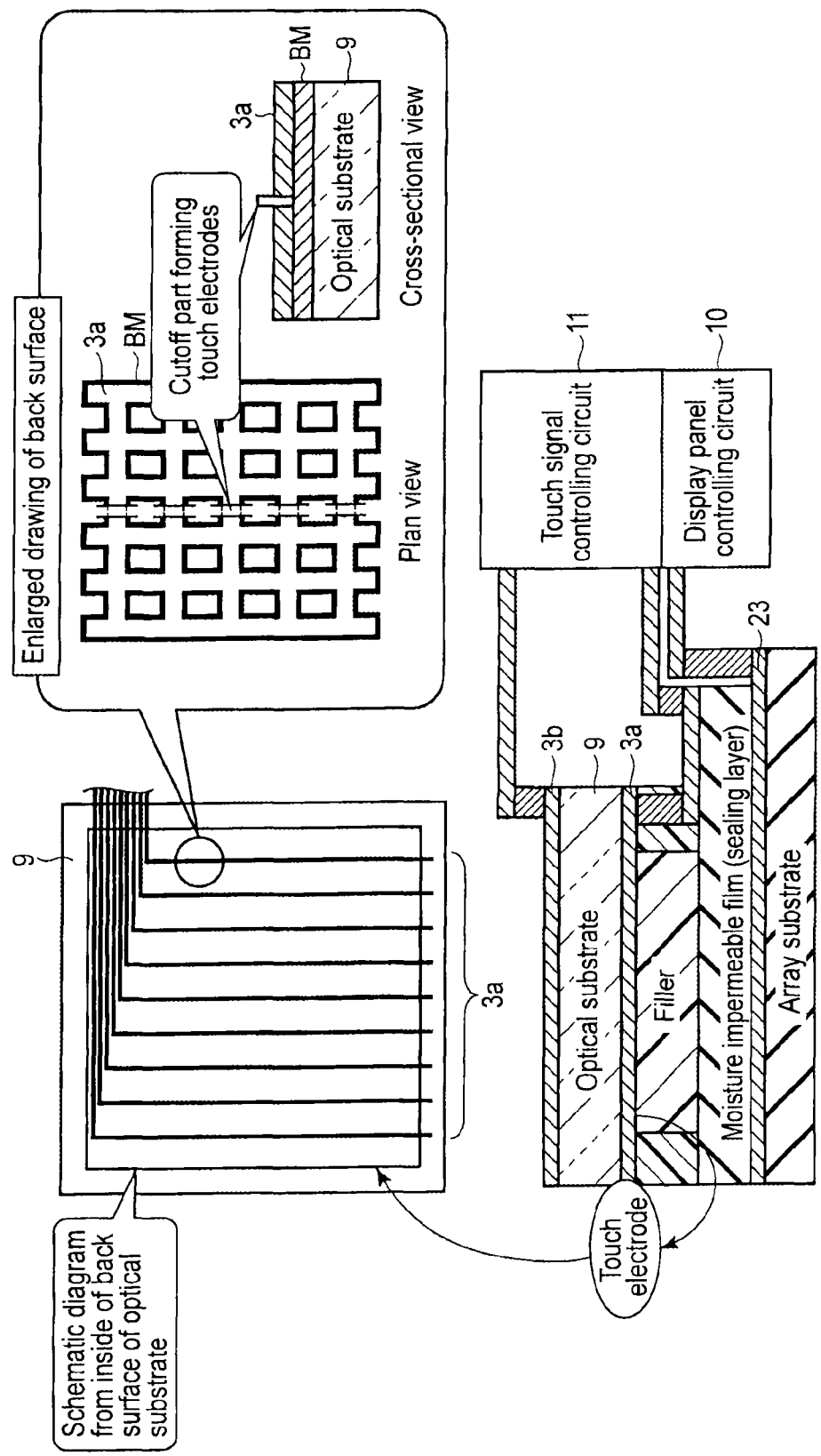
FIG. 10 is a diagram illustrating a structure of touch electrodes in a display device according to a variation of the second embodiment.

FIG. 10 is a diagram illustrating a structure of touch electrodes in the display device according to the variation of the second embodiment.

The lower part of FIG. 10 shows a cross-sectional view of the display device of the variation. Because the cross-sectional view is the same as the cross-sectional view of the display device shown in the lower part of FIG. 8, detailed explanation thereof is omitted. The upper left part of FIG. 10 shows a plan view of the back surface of the optical substrate 9 as viewed from inside. The upper right part of FIG. 10 shows an enlarged view of the back surface.

In the variation, low-resistance conductors are formed and laminated on the black matrix BM. Because the conductors are laminated on the black matrix BM, the conductors are not required to be light-transmitting material, such as ITO indicated in the first embodiment. Thus, it is possible to use a material having low electric resistance even if it is a non-light-transmitting material.

The conductors are provided with cutoff parts to form a plurality of electrodes that extend in a predetermined direction (the vertical direction in FIG. 10). The width of each cutoff part is shorter than an interval (a pitch) between the adjacent low-resistance conductors extending in the predetermined direction.

The electrodes formed as described above are drawn to the frame side and brought into contact with a connecting part 21, and thereby the electrodes can be functioned as first touch electrodes 3a. Although each cutoff part is provided on a vertical straight line in the upper right part of FIG. 10, the cutoff part is not limited to this form, but may be provided to form a plurality of electrodes that extend in a desired direction.

Second touch electrodes 3b may be formed in the same form as that of the first embodiment, or may be formed of low-resistance conductors in the same manner as the first touch electrodes 3a of the second embodiment. Forming both the touch electrodes 3a and 3b of low-resistance conductors suppresses attenuation of the touch signal, and produces a touch signal with high sensitivity.

According to the variation of the second embodiment, it is possible to obtain a touch sensor electrode with high sensitivity.

Comparison With Other Structures

The embodiments explained above have the structure provided with the touch electrodes 3a and 3b without the touch panel substrate illustrated in FIG. 1. However, various forms exist as the structure provided with the touch electrodes 3a and 3b without a touch panel substrate. The following is explanation of advantages of the present application as compared with these various structures.

FIG. 11 is a cross-sectional view illustrating a structure of a display device discussed to be compared with the display device of the present embodiment. In the display device illustrated in FIG. 11, touch electrodes 3a and 3b are provided on the front surface of the optical substrate 9.

In the structure illustrated in FIG. 11, the touch electrodes 3a and 3b are formed after forming an array substrate 4, an OLED light-emitting display layer 5, a moisture impermeable film 6, a filler 8, and an optical substrate 9 in a laminated manner. In the formation, because two electrode layers are provided, the manufacturing process is more complicated than the case of providing one electrode layer. For example, although one electrode layer can be simply formed by mask deposition, providing two electrode layers requires repeatedly executing processing (metal patterning, etching, and interlayer film formation) with a photo mask. However, the processing steps are executed after formation of the OLED light-emitting display layer 5 that must be protected from infiltration of moisture, and protection from water is indispensable. Thus, forming the touch electrodes of two layers on the surface of the optical substrate 9 greatly complicates the manufacturing process.

Figure 12:
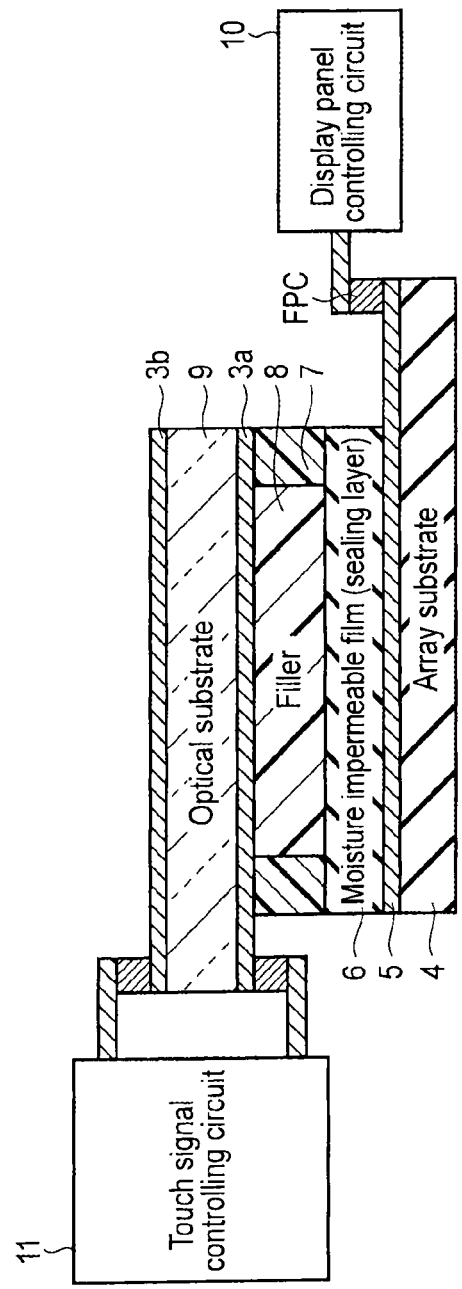
FIG. 12 is a cross-sectional view illustrating a structure of a display device discussed to be compared with the display device of the present embodiment.

FIG. 12 is a cross-sectional view illustrating a structure of a display device discussed to be compared with the display device according to the present embodiment. In the display device illustrated in FIG. 12, the touch electrodes 3a and 3b are provided on the front surface and the back surface of the optical substrate 9, respectively.

In the structure illustrated in FIG. 12, an optical substrate 9 having a back surface provided with the touch electrodes 3b in advance is bonded to the filler 8, and thereafter touch electrodes 3a of a single layer can be formed on the front surface of the optical substrate 9. Thus, this structure simplifies the manufacturing process in comparison with the structure of FIG. 11. However, this structure requires increase of the step of attaching an FPC to extract a signal from the touch electrodes 3b formed on the back surface, and increase in size of the optical substrate 9. Thus, this structure has demerits in both the cost and the module size.

Figure 13:
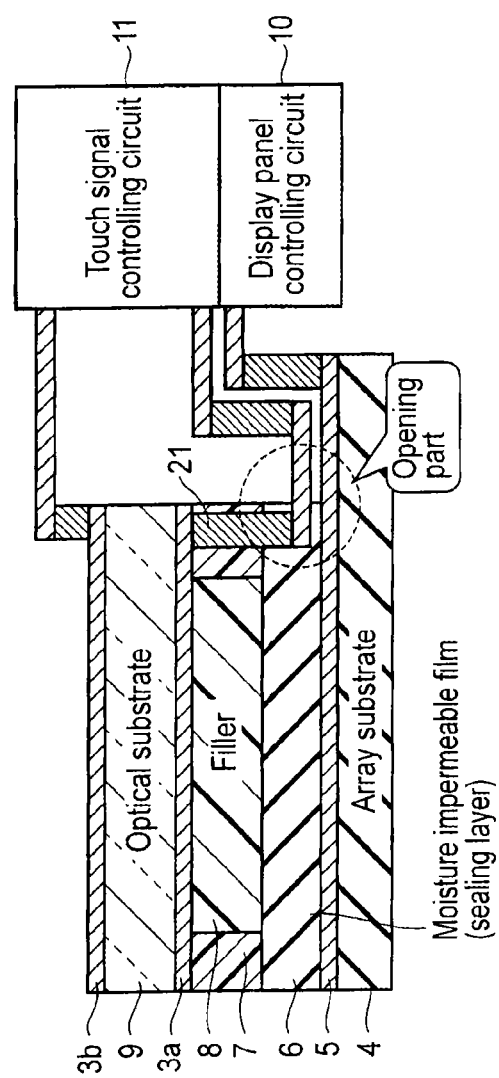
FIG. 13 is a cross-sectional view illustrating a structure of a display device discussed to be compared with the display device of the present embodiment.

FIG. 13 is a cross-sectional view illustrating a structure of a display device discussed to be compared with the display device according to the present embodiment. In the display device illustrated in FIG. 13, the touch electrodes 3a and 3b are provided on the front surface and the back surface of the optical substrate 9, respectively. In addition, a signal of the touch electrodes 3a on the back surface is extracted onto the array substrate 4 via the seal material 7 and the moisture impermeable film 6.

However, in the structure illustrated in FIG. 13, it is difficult to extract a signal of the touch electrodes 3a onto the array substrate 4. Specifically, in the case where a signal is extracted via the seal material 7, the signal can be extracted using conductive particulates such as Au-plated pearl spacers. However, it is impossible to use conductive particulates for the moisture impermeable film 6, and it is also difficult to process the moisture impermeable film 6. Thus, it is impossible to construct any process that can be put into practice.

However, the structure illustrated in FIG. 13 can be constructed with a practical process, when it becomes possible to process the moisture impermeable film 6, or when it is possible to receive and transmit signals by, for example, capacity coupling, without processing the moisture impermeable film 6. Thus, the structure illustrated in FIG. 13 is not excluded from the present application, but claimed as the third embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, although the external extraction electrode 20 is connected with the first touch electrodes 3a via conductive particulates in the above embodiments, signals may be transmitted and received between the electrodes via capacitive elements (parasitic capacitance) formed between the electrodes, when the interval between the electrodes can be shortened and the areas of the electrodes can be increased. Signals may also be transmitted and received between the external extraction electrode 20 and the second touch electrodes 3b via capacitive elements (parasitic capacitance).

Various inventions can be made by proper combinations of a plurality of constituent elements disclosed in the above embodiments. For example, some constituent elements may be deleted from the constituent elements disclosed in the embodiment. In addition, constituent elements of different embodiments may be used in combination.

What is claimed is:

1. A display device comprising:
   a first substrate including a first region and a second region surrounding the first region;
   a sealing film covering the first region and the second region; and
   a touch sensor above the sealing film, wherein
   the first region includes organic light emitting elements arranged in a matrix,
   the touch sensor includes touch electrodes,
   each of the touch electrodes extends in a first direction,
   the touch electrodes are arranged in a second direction differing from the first direction,
   each of the touch electrodes includes protruded portions, and
   each of the protruded portions extends in a predetermined direction.

2. The display device according to claim 1, wherein one of the touch electrodes is adjacent to another of the touch electrodes, and
   each of the protruded portions of the one of the touch electrodes faces a corresponding one of the protruded portions of the another of the touch electrodes in the predetermined direction.

3. The display device according to claim 2, wherein one of the protruded portions of the one of the touch electrodes faces one of the protruded portions of the another of the touch electrodes with a gap in the predetermined direction,
   each of the touch electrode includes openings in a matrix, and
   the gap is smaller than a width of one of the openings in the predetermined direction.

4. The display device according to claim 1, further comprising:
   electrodes which are connected to a drive circuit configured to drive the organic light emitting elements and are arranged between the sealing film and the first substrate; and
   a resin layer which covers the sealing film and overlaps the first region in a plan view, wherein
   the electrodes overlap the second region of the first substrate, each of the touch electrodes includes a first portion overlapping the first region and a second portion overlapping the second region, the first portion includes the protruded portions, the second portion is arranged between the sealing film and the resin layer, the second portion includes a side surface covered by the resin layer, a bottom surface covered by the sealing film, and an upper surface covered by the resin layer, and each of the electrodes is arranged between the sealing film and the first substrate.

5. The display device according to claim 1, further comprising:

electrodes which are connected to a drive circuit configured to drive the organic light emitting elements and are arranged between the sealing film and the first substrate; and a resin layer which covers the sealing film and overlaps the first region in a plan view, wherein the electrodes overlap the second region of the first substrate, each of the touch electrodes includes a first portion overlapping the first region and a second portion overlapping the second region, the first portion includes the protruded portions, the second portion is arranged between the resin layer and the first substrate, each of the electrodes is arranged between the sealing film and the first substrate, and a first FPC terminal connected to each of the electrodes and a second FPC terminal connected to the second portion are arranged on a third region of the first substrate arranged outside a region of the first substrate covered by the sealing film.

6. A display device comprising:

a first substrate including a first region and a second region surrounding the first region;

a sealing film covering the first region and the second region; and a touch sensor above the sealing film, wherein the first region includes organic light emitting elements arranged in a matrix, the touch sensor includes touch electrodes, each of the touch electrodes extends in a first direction, the touch electrodes are arranged in a second direction differing from the first direction, each of the touch electrodes includes pairs of protruded portions, the pairs of protruded portions are arranged at regular intervals in each of the touch electrodes, and each of the pairs of protruded portions extends in a predetermined direction.

7. The display device according to claim 6, wherein one of the touch electrodes is adjacent to another of the touch electrodes, and each of the pairs of protruded portions of the one of the touch electrodes faces a corresponding pair of the pairs of protruded portions of the another of the touch electrodes in the predetermined direction.

8. The display device according to claim 7, wherein each of the pairs of the protruded portions of the one of the touch electrodes faces a corresponding pair of the pairs of the protruded portions of the another of the touch electrodes with a pair of gaps in the predetermined direction, each of the touch electrode includes openings in a matrix, and each of the gaps is smaller than a width of one of the openings in the predetermined direction.

9. The display device according to claim 6, further comprising:

electrodes which are connected to a drive circuit configured to drive the organic light emitting elements and are arranged between the sealing film and the first substrate; and a resin layer which covers the sealing film and overlaps the first region in a plan view, wherein the electrodes overlap the second region of the first substrate, each of the touch electrodes includes a first portion overlapping the first region and a second portion overlapping the second region, the first portion includes the protruded portions, the second portion is arranged between the sealing film and the resin layer, the second portion includes a side surface covered by the resin layer, a bottom surface covered by the sealing film, and an upper surface covered by the resin layer, and each of the electrodes is arranged between the sealing film and the first substrate.

10. The display device according to claim 6, further comprising:

electrodes which are connected to a drive circuit configured to drive the organic light emitting elements and are arranged between the sealing film and the first substrate; and a resin layer which covers the sealing film and overlaps the first region in a plan view, wherein the electrodes overlap the second region of the first substrate, each of the touch electrodes includes a first portion overlapping the first region and a second portion overlapping the second region, the first portion includes the protruded portions, the second portion is arranged between the resin layer and the first substrate, each of the electrodes is arranged between the sealing film and the first substrate, and a first FPC terminal connected to each of the electrodes and a second FPC terminal connected to the second portion are arranged on a third region of the first substrate arranged outside a region of the first substrate covered by the sealing film.

* * * * *